United States Patent
Felder (10) Patent No.: US 7,209,069 B2
(45) Date of Patent: Apr. 24, 2007

(54) SUCCESSIVE APPROXIMATION ANALOG-TO-DIGITAL CONVERTER WITH CURRENT STEERED DIGITAL-TO-ANALOG CONVERTER

(75) Inventor: Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/105,015

(22) Filed: Apr. 13, 2005

(65) Prior Publication Data

US 2006/0232461 A1  Oct. 19, 2006

(51) Int. Cl.
*H03M 1/34* (2006.01)
(52) U.S. Cl. .................. 341/163; 341/155; 341/144
(58) Field of Classification Search .............. 341/155, 341/144, 163
See application file for complete search history.

(56) References Cited

U.S. PATENT DOCUMENTS

| | | | | |
|---|---|---|---|---|
| 5,055,847 A | * | 10/1991 | Rybicki et al. | 341/162 |
| 5,638,075 A | * | 6/1997 | Nakajima | 341/163 |
| 5,831,562 A | * | 11/1998 | Van Auken et al. | 341/122 |
| 6,008,749 A | * | 12/1999 | Smith | 341/163 |
| 6,909,391 B2 | * | 6/2005 | Rossi | 341/161 |
| 6,927,714 B1 | * | 8/2005 | Teterwak | 341/136 |
| 6,954,163 B2 | * | 10/2005 | Toumazou et al. | 341/144 |

* cited by examiner

*Primary Examiner*—Peguy JeanPierre
(74) *Attorney, Agent, or Firm*—Garlick Harrison & Markison; Kevin L. Smith (57) ABSTRACT

A successive approximation Analog-to-Digital Converter ("ADC") having a successive approximation controller operably coupled to convert a control signal into a digital output of the successive approximation ADC, a current-steered Digital-to-Analog Converter operably coupled to convert the digital output of the successive approximation ADC into an analog feedback signal, and a comparator module operably coupled to compare the analog feedback signal with an analog input of the successive approximation ADC to produce the control signal. A further aspect is a method for increasing accuracy for a digital successive approximation of an analog input signal. The method includes determining a signal characteristic of the analog input signal to an Analog-to-Digital Converter ("ADC"), and selecting a reference voltage source of a Digital-to-Analog Converter of the ADC from a plurality of reference voltage sources based on the analog input signal.

14 Claims, 7 Drawing Sheets

FIG. 8
voltage reference selector 280

FIG. 6
thermometer-coded circuit 260

SUCCESSIVE APPROXIMATION ANALOG-TO-DIGITAL CONVERTER WITH CURRENT STEERED DIGITAL-TO-ANALOG CONVERTER

TECHNICAL FIELD

This invention relates generally to mixed-signal processing, and more particularly to digital-to-analog converters.

BACKGROUND

Integrated circuits are used in a wide variety of electronic equipment, including portable, or handheld, devices. Such handheld devices may include personal digital assistants ("PDA"), compact disc players, MPEG-1 Layer 3 digital audio ("MP3") players, digital video disc players, AM/FM radio, a pager, cellular telephones, computer memory extension (commonly referred to as a thumb drive), etc.

To provide functionality, these handheld devices include one or more integrated circuits. For example, a thumb drive may include an integrated circuit for interfacing with a computer (for example, personal computer, laptop, server, workstation, etc.) via one of the ports of the computer (for example, Universal Serial Bus, parallel port, etc.) and at least one other memory integrated circuit (for example, flash memory). As such, when the thumb drive is coupled to a computer, data can be read from and written to the memory of the thumb drive. Accordingly, a user may store personalized information (for example, presentations, Internet access account information, etc.) on the thumb drive and use any computer to access the information.

Many of the integrated circuits used in handheld devices include mixed signal circuitry such as analog to digital converters ("ADC") and digital to analog converters ("DAC"). As is known, analog to digital converters convert an analog signal into a corresponding digital value. There are different implementations of analog to digital converters having, accordingly, different resolution and sampling rate characteristics for intended ADC uses. For example, flash-type ADCs have a lower resolution (that is, less than 10 bits) and a fast conversion, or sample, rate that can typically achieve 1 Giga-samples-per-second. In contrast, integrating-type ADCs have a higher resolution (generally between 16-to-24 bits) and a slower conversion, or sample, rate of about 1 kilo-samples-per-second. Successive approximation-type ADCs come within the midrange of resolutions and sampling rates for analog-to-digital converters.

A successive approximation ADC converts an analog input to a digital output by successively comparing the analog input with digital bit values of finer resolution. Conventionally, a successive approximation ADC has a sample-and-hold circuit that receives an analog input signal. The sample-and-hold circuit output is provided to a comparator along with a capacitative digital-to-analog converter signal input provided in a feedback loop from a successive approximation controller. At the start of a conversion, the successive approximation ADC sets the output of a successive approximation register such that all bits except the most significant bit produces a logic low or "0". The resulting output of the capacitative DAC is set to midcode of the analog-to-digital converter full-scale input. The comparator output is based on the difference between the capacitative DAC output and the sampled analog voltage.

While conventional successive approximation ADCs have been used in integrated circuits, limitations do exist. For instance, a conventional successive approximation ADC is prone to conversion error due inadequate settling in the sample-and-hold circuitry. Also, conventional successive approximation ADCs are subjected to increased cost and complexity in the fabrication process to incorporate those architectures.

Therefore, a need exists for an successive approximation analog-to-digital converter that that substantially overcomes the above mentioned limitations.

SUMMARY

Provided is a successive approximation Analog-to-Digital Converter ("ADC") having a successive approximation controller operably coupled to convert a control signal into a digital output of the successive approximation ADC, a current-steered Digital-to-Analog Converter operably coupled to convert the digital output of the successive approximation ADC into an analog feedback signal, and a comparator module operably coupled to compare the analog feedback signal with an analog input of the successive approximation ADC to produce the control signal.

Another aspect is a method for increasing accuracy for a digital successive approximation of an analog input signal. The method includes determining a signal characteristic of the analog input signal to an Analog-to-Digital Converter ("ADC"), and selecting a reference voltage source of a Digital-to-Analog Converter of the ADC from a plurality of reference voltage sources based on the analog input signal.

DETAILED DESCRIPTION

Figure 1:
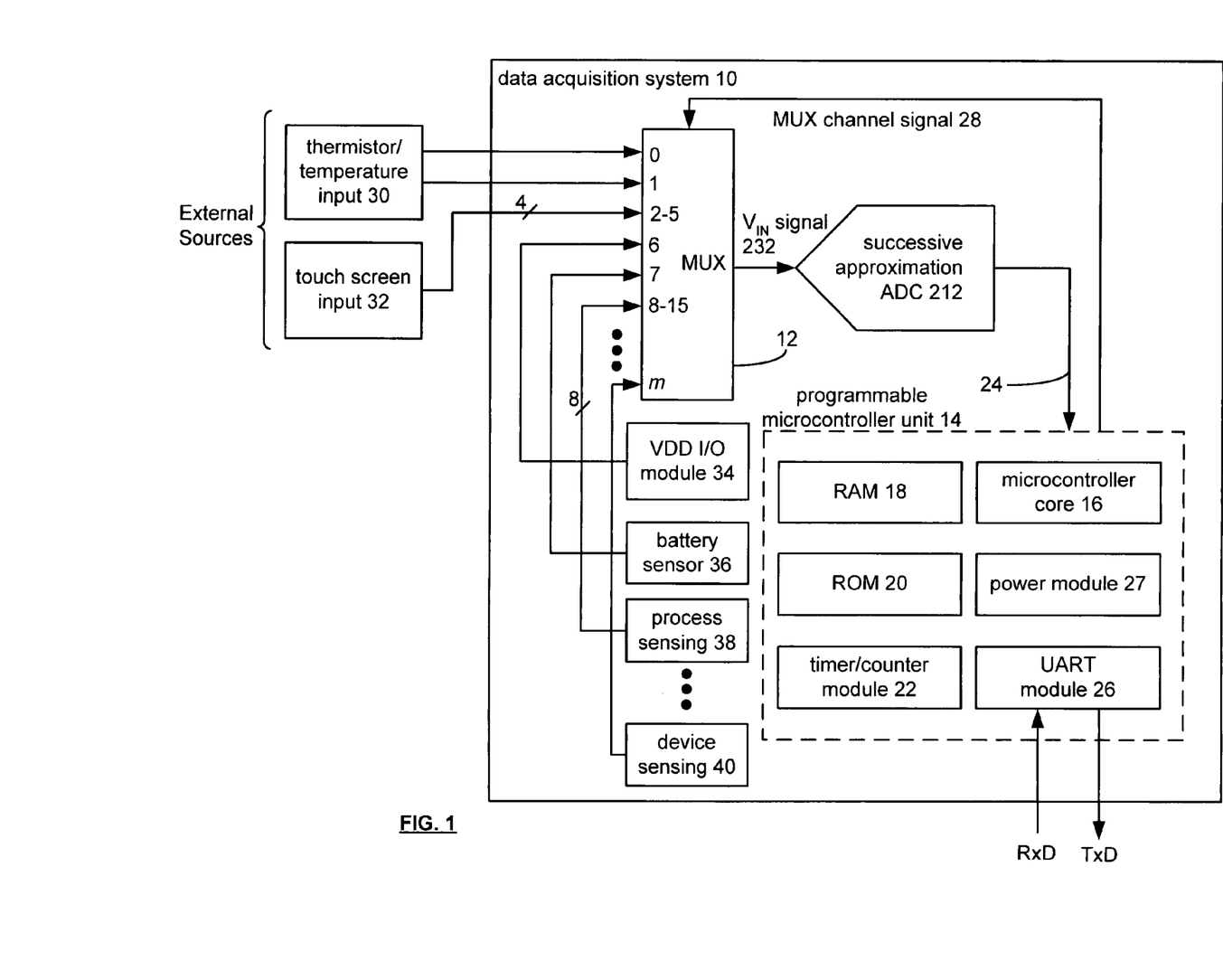
FIG. 1 is a schematic block diagram of a data acquisition system having a successive approximation analog-to-digital converter in accordance with the present invention.

FIG. 1 is a schematic block diagram of a data acquisition system 10 having a successive approximation analog-to-digital ("ADC") 212, a programmable microcontroller unit 14, and a MUX 12 having multi-channel signal inputs 0 through m. Note that the microcontroller unit 14 may also be provided as a microprocessor, digital signal processor, state machine and/or logic circuitry. The data acquisition system 10 can implemented as part of a system-on-a-chip ("SOC") device, as a component to a hand-held device, as a personal computer plug-in data-acquisition board, as a personal-computer external data-acquisition system, etc.

The data acquisition system 10 has a successive approximation ADC 212, which is provided a multi-channel input by a MUX 12 controlled by a programmable microcontroller unit 14. The programmable controller unit core 16 is supported by a random access memory ("RAM") 18 and a read only memory ("ROM") 20. As is known in the art, the RAM 18 and the ROM 20 may be provided by a variety of memory devices or architectures, such as reprogrammable memory and/or any circuitry that stores operational instructions. For example, the RAM 18 may be implemented on-chip as a Static RAM. The ROM 20 may be provided as an on-chip Flash/EE memory, containing program and associated data portions, accordingly.

Support functions for the programmable microcontroller unit 14 include a microcontroller core 16, a timer/counter module 22, a data line, or bus, 24 operably coupled to the successive approximation ADC 212, and a UART module 26 for serial data input and output. Normal, idle, and power-down operating modes for the microcontroller core 16 and the successive approximation ADC 212, and other associated circuitry, are provided by power module 27 for flexible power management suited to low-power applications.

The programmable microcontroller unit 14 provides a selection of channels 0 through m of the MUX 12 through a MUX channel signal 28. The channels 0 through m can be from external sources and/or internal sources presented for conversion via the $V_{IN}$ signal 232. As shown, the MUX 12 is configured for external channels 0 through 5, and internal channels 6 through m. As is readily apparent by those skilled in the art, the amount of channels can be increased or decreased, or designated external or internal, as desired.

The $V_{IN}$ signal 232 has a set of signal characteristics set out by the circuit architecture and configuration of the data acquisition system 10. An example of the signal characteristics allocated to the signal channels 0 through m are designated with the signal characteristic of "internal" or "external." Labeling or identifying signal characteristics of the $V_{IN}$ signal 232 provides the ability to improve the accuracy for the digital successive approximation of the analog input signal $V_{IN}$. Conversion improvement is obtainable through selection of reference voltage sources responsive to the signal characteristics. Obtaining improved accuracy in this regard is discussed later in detail with respect to FIG. 8. Notably, other varieties of signal characteristics could be used, such as channel designation, internal sources, other external environments, etc.

The external sources shown are a thermistor/temperature input 30 operably coupled to channels 0 and 1, and a touch screen input 32 operably coupled to channels 2 through 5.

The thermistor/temperature input 30 can provide temperature sensing and correction parameters of external devices or components, as well as being used as specialty temperature sensing probes for commercial, science and industry applications. Thermistors typically work over a relatively small temperature range, and provide accurate and precise data within that range.

The touch-screen input 32 relates to a touch screen interface, which in the embodiment illustrated is a four-wire resistive touch screen. A touch screen interface is operably coupled to a 4-wire resistive touch screen. The successive approximation ADC 212 provides a readout of touch screen parameters to the programmable microcontroller unit 14 for further processing.

Internal voltage sources are generally considered to be "on chip" sources, or other internal system device sources utilizing the data acquisition system 10. The internal sources shown are VDD I/O module 34 as operably coupled to channel 6, a battery sensor module 36 as operably coupled to channel 7, a process sensing module 38 as operably coupled to channels 8 through 15, and an example of a further device sensing module 40 operably coupled through additional available channels as provided, represented by the variable m.

The VDD I/O module 34 provides voltage measurement to the channel for assessment of the supply voltage VDD levels of the device. The battery sensor module 26 provides voltage values that can be used by the power module 27 in providing power management suited to low-power applications, which are generally less than 5-volts. The process sensing module 38 provides voltage values such as threshold voltage for analog circuitry, related to headroom voltage determinations and associated power supply adjustments to optimize the power supplied to a device. The device sensing module 40 represents additional measurement availability, such as with other process parameters or other power supply values that can be made available for measurement by the successive approximation ADC 212 are available.

The successive approximation ADC 212 operates at a designated sample rate, which is from about 1 kilo-samples-per-second to about 5 mega-samples-per-second. The sample rate leaves the programmable microcontroller 14 with a specific interval of time to read the result of the successive approximation ADC 212 over the data line 24, and to store the result in RAM 18 for further processing within that interval of time. Otherwise, the next sample derived by the successive approximation ADC 212 could be lost.

To illustrate, with a 200 kHz sampling rate, the successive approximation ADC 212 has a conversion speed of 5 microseconds. Accordingly, the programmable microcontroller unit 14 has a small amount of time—which in this example, is 5 microseconds divided by the resolution number of the ADC—to read and store the result of the successive approximation ADC 212.

If an interrupt-driven routine is used, the programmable microcontroller unit 14 would also have to jump to an ADC Interrupt Service routine. Doing so would increase the time required to store the ADC results. In applications where the programmable microcontroller unit 14 cannot sustain the interrupt rate, the data line 24 can be provided as a direct memory access ("DMA") operation mode to provide suitable time for the read and storage functions with the RAM 18.

Accordingly, the data acquisition system 10 of FIG. 1 provides an example of uses of an successive approximation ADC 212. As can be readily appreciated by those skilled in the art, other deployments and uses of the successive approximation ADC 212.

Figure 2:
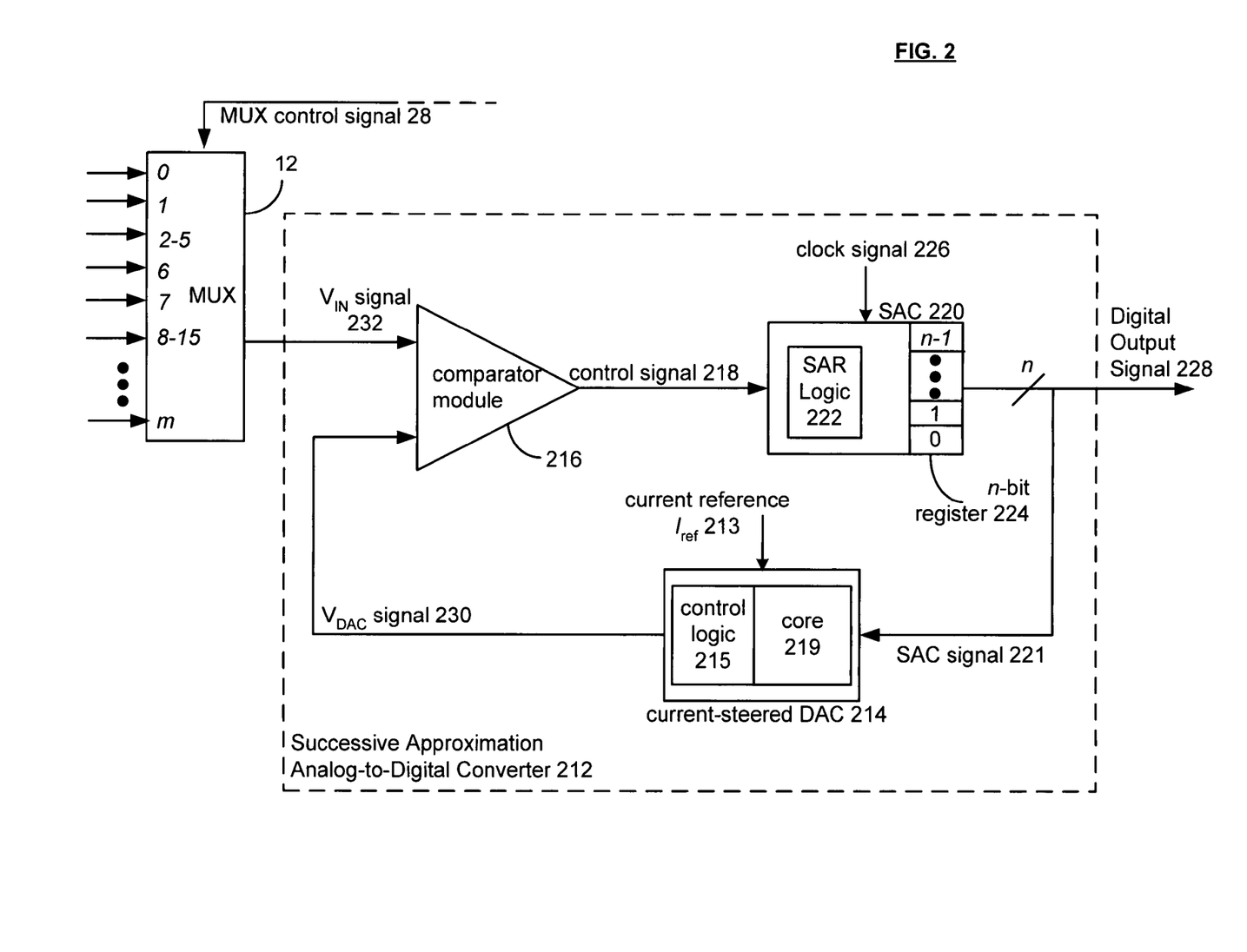
FIG. 2 is a schematic block diagram of the successive approximation analog-to-digital converter of FIG. 1.

FIG. 2 is a schematic block diagram of a successive approximation analog-to-digital converter ("ADC") 212 having a current steered DAC 214, as used with the data acquisition system 10 of FIG. 1. The successive approximation ADC 212 provides greater accuracy and scalability compared to a conventional capacitative DAC. With a successive approximation analog-to-digital converter ("ADC") 12, the digital output result is achieved by evaluating the input analog $V_{IN}$ signal 232 one bit at a time, starting at the most significant bit. In operation, the successive approximation ADC 212 implements a binary search algorithm, as is discussed in greater detail with FIGS. 3 and 4.

Successive approximation ADCs provide sufficient resolution (10-to-12 bits) at a relatively fast conversion rate, and are useful for measurement applications or other similar applications calling for similar resolution levels and associated accuracy. For example, a 10-bit resolution uses 10 clock cycles are needed for providing a digital output, where the maximum clock rate depends on the comparator module 216 settling and digital delays in the SAC 220.

As shown in FIG. 2, the successive approximation analog-to-digital converter ("ADC") 212 has a current-steered digital-to-analog converter ("DAC") 214, a comparator module 216, and a successive approximation control ("SAC") module 220.

The current-steered DAC 214 has a core 219 having a number of controllable current sources, each being controllable between a first state and a second state, as is discussed in detail later herein with respect to FIGS. 6 and 7. The current-steered DAC 214 also has a control logic module 215, which is operably coupled to the DAC core 219. The control logic module 215 controls the analog conversion at sampling intervals and controls respective core controllable current sources 217 of the current-steered DAC 214 to switch from a first state to a second state.

The current-steered DAC 214 converts a current state of the digital output signal 228 into an analog feedback signal $V_{DAC}$ 230 based on a maximum voltage $V_{MAX}$, which is the maximum output voltage, or maximum digital code, of the DAC 214. Further discussion of the successive approximation ADC conversion process is provided with respect to FIGS. 3 and 4.

The comparator module 216, which may be an operational amplifier, a resistive divider ladder and comparator, or other comparative circuit configurations, compares the analog $V_{IN}$ signal 232 with the analog $V_{DAC}$ signal 230 to provide a control signal 218 to the SAC 220.

Optionally, the ADC 212 may be used for converting high-frequency signals or other such varying analog signals by providing the comparator module 216 with a sample-and-hold circuit. The sample-and-hold circuit provides a sample-state and a hold-state for the processing of varying signal inputs having values that fluctuate or change at a rate greater than the conversion speed of the successive approximation ADC 212. That is, a sample-and-hold circuit operates to generate a selectively sampled-and-held representation of the analog signal inputs. Such analog signal inputs may be higher-frequency signals including audio or video data, etc.

As an example, the basic representation of a sample-and-hold circuit is a switch with a sampling capacitor operably coupled between the analog $V_{IN}$ signal 232 and ground. The sample-and-hold circuit is in the sample state when the switch is closed. When the switch opens the sample-and-hold circuit is in the hold-state, where the last instantaneous value of the analog signal input to the sample-and-hold circuit is held on the sampling capacitor. As can be readily appreciated by those skilled in the art, various circuit configurations and arrangements may be provided to implement a suitable sample-and-hold circuit with respect to the nature of the signals to be converted with the successive approximation ADC 212.

With analog signals presenting data regarding temperature, analog voltage characteristics, or the like, however, the rate of change is generally less than the conversion speed of the successive approximation ADC 212 of FIG. 2. Accordingly, for signals having data values that change at rates less than the conversion speed of the successive approximation ADC 212, or values that change within acceptable tolerances (for example, changes due to thermal noise, power fluctuations, etc.), the sample-and-hold circuit is optional.

In operation, the successive approximation ADC 212 accepts an analog $V_{IN}$ signal 232 which represents the analog value to be converted to its digital representation. As shown, by way of example, the analog $V_{IN}$ signal 232 can be provided by the MUX 12, as discussed in greater detail with respect to FIG. 1.

The MUX 12 has a plurality of analog input channels 0 through m. One of the plurality of inputs is selected via a MUX control signal 28 as the analog input $V_{IN}$ signal 232. In general, the analog signals presented for digital conversion include, but are not limited to, analog circuit-related measurement signals, power supply voltage level signals, threshold voltage signals of analog circuitry of an integrated circuit, sensed-temperature value signals, etc. The channels 0 through m may also provide audio or higher frequency voltages for conversion to a digital representation.

Also, it should be noted that the successive approximation ADC 212 can receive analog signal inputs $V_{IN}$ 232 from sources other than the MUX 12. For example, analog signal inputs are provided from an input/output module, other analog circuitry on an integrated circuit, or from a microprocessor, a controller or other such logic circuit.

The SAC 220 has a successive approximation register ("SAR") logic 222 that manipulates an n-bit register 224 with respect to the control signal 218. The n-bit register 224 has a least significant bit ("LSB") $2^0$ through a most significant bit ("MSB") $2^{n-1}$.

The clock signal 226 provides the timing mechanism for the SAR logic 222 of the SAC 220 to perform n comparisons for the digital result contained in the n-bit register 224. In operation, the contents of the n-bit register 224 sets the DAC 214 output. That is, at the start of a conversion the SAC 220 sets the n-bit register 224 value such that all bits except the most significant bit ("MSB"), at n−1, produce a logic low or "0". Doing so sets the current-steered DAC 214 output, $V_{DAC}$ signal 230, to one-half of the successive approximation ADC 212 full-scale input of the DAC code, or $V_{MAX}$, value. The comparator module 216 sets its output based on the difference between the $V_{DAC}$ signal 230 and the $V_{IN}$ signal 232.

Iterations continue over n comparisons, which correlates to the resolution (or bit value) of the successive approximation ADC 212. Once n comparisons are conducted, the contents of the n-bit register 224 are provided over the digital output signal 228. The digital output signal 228 can be provided as a serial output, or a parallel output, having an n-bit binary result.

The analog $V_{IN}$ signal 232 is provided to the comparator module 216. The comparator module 216 functions to compare the analog $V_{IN}$ signal 232 with the input signal $V_{DAC}$ 230 from the current-steered analog-to-digital ("DAC") 214. The comparison result is provided as a control signal 218 to the successive approximation controller ("SAC") 220.

Improved precision and accuracy of the successive approximation ADC 212 is recognized by use of a current-steered DAC 214. Generally, successive approximation ADC modules had been provided with capacitative DACs because of their favorable power consumption characteristics. To reduce performance errors in capacitative DACs, however, the capacitors would need to be production-trimmed. But capacitor trimming alone does not compensate for capacitative DAC performance changes caused by temperature, supply voltage, and other parameters. Compensation for these changes had generally required additional calibration digital-to-analog converters to account for resulting capacitor errors.

But the presence of even nominal capacitor mismatch could influence the output of a successive approximation ADC where greater accuracy and scalability is called for digital assessment of an analog signal input. Further, capacitative DACs would normally require a sample-and-hold function to hold the analog signal $V_{IN}$ being sampled.

Though the power requirement of a current-steered DAC 214 is greater than that of a capacitative DAC, the increased resolution and scalability compensate for the greater power requirement.

Also, due to the performance characteristics and elimination of relying on the capacitive circuit structure, a sample-and-hold module becomes optional with a current-steered DAC. Furthermore, elimination of the capacitative circuit structure in the successive approximation ADC 12 of FIG. 2 allows the use of generic IC manufacturing processes because capacitor matching data is not required.

Figure 3:
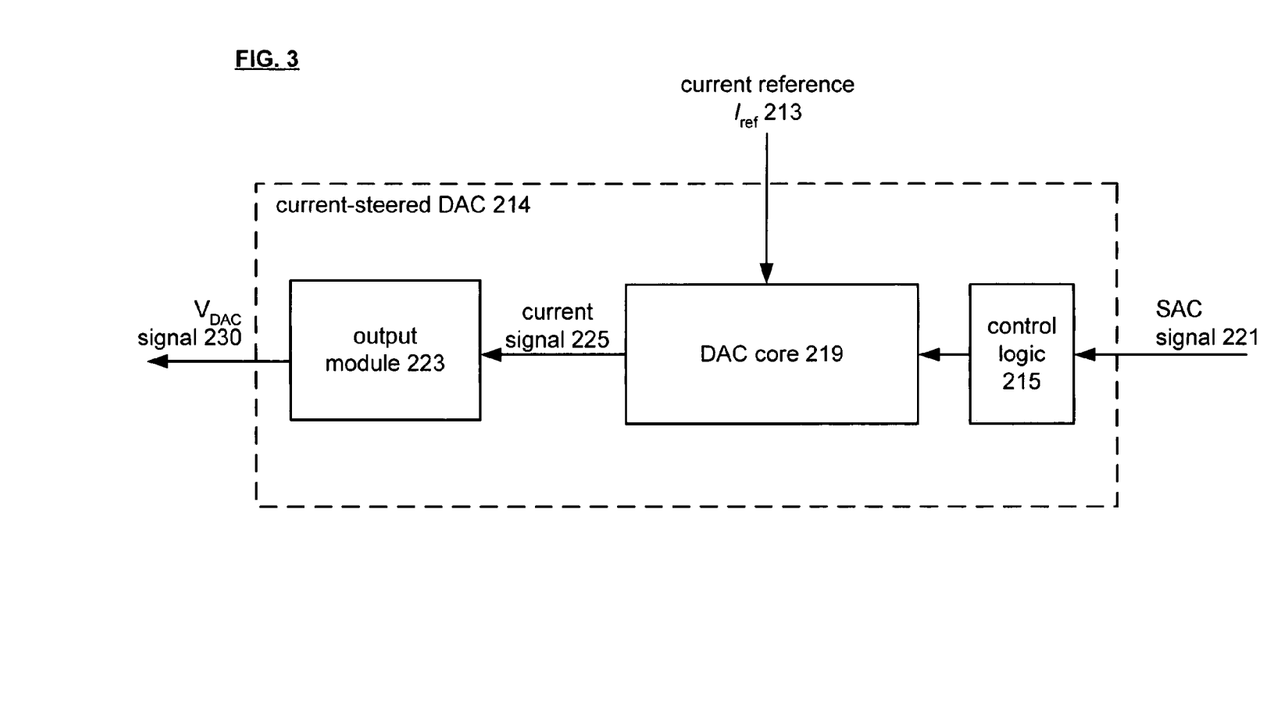
FIG. 3 is a schematic block diagram of the current-steered digital-to-analog converter ("DAC") of the successive approximation analog-to-digital converter of FIG. 2.

FIG. 3 is a schematic block diagram of a current-steered DAC 214. The DAC 214 has a DAC core 219, a control logic 215, and a control amplifier 240. The DAC core 219 contains controllable current-sources 217, discussed in detail with regard to FIGS. 6 and 7. The control logic 215 receives the SAC signal 221.

The control logic 215 translates the SAC signal 221 to a format suitable for control of the controllable current sources of the DAC core 219. With the translated SAC signal 221, the controllable current sources of the DAC core 219 are set by the control logic 215 accordingly.

A current reference $I_{ref}$ 213 is provided to the DAC core 219. The DAC core 219 produces a current signal 225 that is proportional to the current reference $I_{ref}$ 213 and the digital value of the SAC signal 221. As can be readily appreciated by those skilled in the art, the current reference $I_{ref}$ 213 may be provided by a bandgap reference circuit, or other suitable reference circuits allowing a favorable drive capability and a output scalability.

The current signal 225 is provided to an output module 223. The output module 223 converts the current signal 225 to a scaled voltage output $V_{DAC}$ signal 230. The output module 223 is provided by a passing the current signal 225 across a resistor to provide the $V_{DAC}$ signal 230. It should be noted that the output module 223 may also be provided by low impedance devices such as an operational amplifier and resistor in a current-to-voltage configuration, or other suitable configurations to provide the $V_{DAC}$ signal 230.

Figure 4:
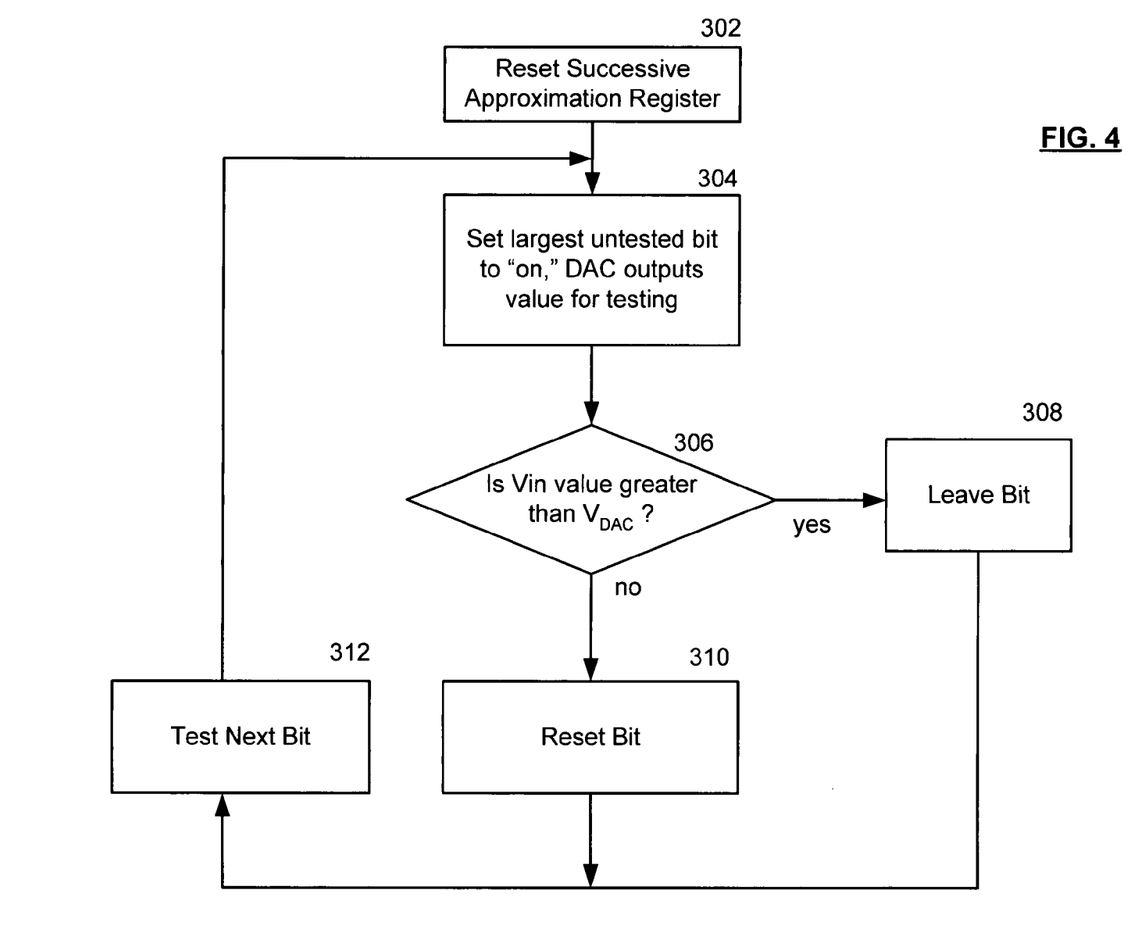
FIG. 4 is a logic diagram illustrating successive approximation of an analog input signal in accordance with the present invention.
Figure 5:
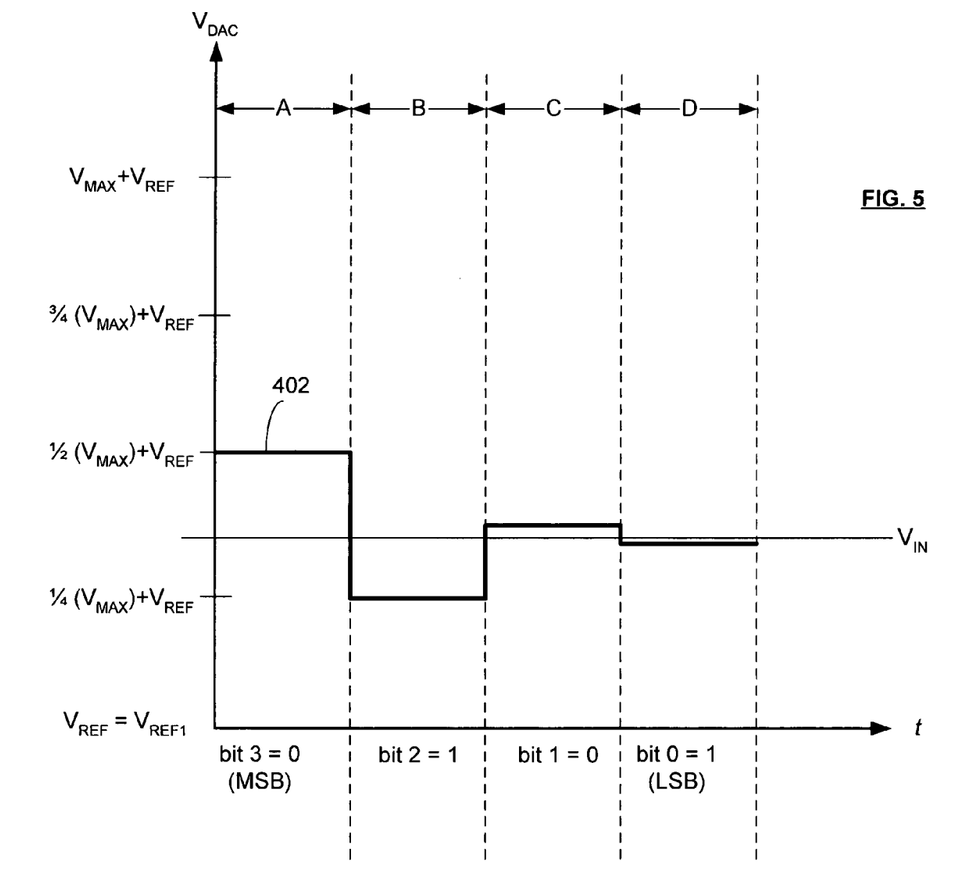
FIG. 5 illustrates a graphical representation of an n-bit analog-to-digital conversion in accordance with the present invention.

The operation of the successive approximation ADC 212 with the current-steered DAC 214 is discussed further with respect to FIGS. 4 and 5.

FIG. 4 is a logic diagram illustrating successive approximation of an analog input signal $V_{IN}$. At step 302, the n-bit register 224 (see FIG. 2) is reset to the DAC midcode (that is, 100 . . . 00, where the MSB is set to a logic high or '1') at step 304, where the $V_{DAC}$ signal initially has the value of $V_{MAX}/2+V_{REF}$, where $V_{MAX}$ is the maximum output voltage of the current-steered DAC 214, also referred to as the DAC maximum code. The value of $V_{MAX}$ is set by the maximum current of the current-steered DAC 214 that is influenced by the reference current $I_{ref}$, and the resistive load of the output module 223. Voltage $V_{REF}$ is the lower reference voltage, also referred to as ground reference, for the current-steered DAC 214. The reference voltage $V_{REF}$ is an adjustable reference voltage, which is selectable from at least two voltage references, and is discussed further with respect to FIG. 8. For the purposes of this example, the reference voltage $V_{REF}$ is equal to a voltage reference $V_{REF1}$.

A comparison is then performed (step 306) to determine if the analog input $V_{IN}$ signal 232 is less than or greater than the $V_{DAC}$ signal 230 (see FIG. 2). If the analog input signal $V_{IN}$ is greater than the $V_{DAC}$ signal, the control signal 218 from the comparator module 216 is a logic high or '1' and the MSB of the n-bit register 224 remains at a logic '1' (step 308). Conversely, if the analog input $V_{IN}$ signal 232 is less than the $V_{DAC}$ signal 230, the control signal 218 from the comparator module 216 is a logic low and the MSB of the n-bit register 224 is cleared or reset to a logic low or '0' (step 310).

The SAR logic 222 then moves to the next bit down (step 312), forces that bit high (step 304), and performs another comparison (step 306). The sequence continues through the LSB of the n-bit register 224. Once reaching the LSB of the n-bit register 224, the conversion is complete, and the n-bit digital data is available from the register 224 over the digital output signal 228. In this manner, a successive approximation of an analog signal is conducted to produce a digital representation.

FIG. 5 shows an example of an n-bit analog-to-digital conversion, which, as one of ordinary skill in the art will appreciate, is representative of the functionality of an n-bit analog to digital conversion. The y-axis corresponds to voltages of the $V_{DAC}$ signal 230 voltage. The x-axis intersects the y-axis at a ground reference voltage $V_{REF}$ for the DAC 214 (see FIG. 3) and corresponds to time t. Line 402 represents the $V_{DAC}$ signal 230 that is compared to the analog $V_{IN}$ signal 232 (see FIG. 2).

The reference voltage $V_{REF}$ is an adjustable reference voltage, which is selectable from at least two voltage references. The ground reference voltage is selected based on the source, or channel, of the analog $V_{IN}$ signal 232, as is described further with respect to FIG. 8. For example, if the analog $V_{IN}$ signal 232 is provided by a first channel, then the reference voltage $V_{REF}$ may be the ground reference $V_{REF1}$ for that channel. On the other hand, if the analog $V_{IN}$ signal 232 is provided by a second channel, then the reference voltage $V_{REF}$ may be the ground reference $V_{REF2}$ for that channel.

The first comparison, in comparison period A, shows that the analog input signal $V_{IN}$ is less than the VDAC signal. Thus, the MSB 3 is set to a logic low or '0'. The register 224 of the current-steered DAC 214 is then set to '0100' and the second comparison is performed at comparison period B. As the analog input signal $V_{IN}$ is greater than the $V_{DAC}$ signal, bit 2 remains at logic high or '1'. The register 224 of the current-steered DAC 214 is then set to '0110', and the third comparison is performed at comparison period C. As shown, bit 1 is set to logic '0', and the register 224 is then set to 0101 for the final comparison. Finally, at comparison period D, bit 0 remains at logic high or '1' because the analog input voltage $V_{IN}$ is greater than the $V_{DAC}$ signal.

As shown in FIG. 5, the comparison periods A through D illustrate the process of the successive approximation of an analog input. In general, an n-bit successive approximation ADC will use n comparison periods. The next bit conversion will not take place until the present comparison is completed. Note that greater resolution can be achieved using a greater number of bits, for example, from 14 to 16 bits. Alternatively, greater conversion speed can be achieved with a smaller number of bits, for example, from 8 to 10 bits.

The use of a current-steered DAC 214 in the successive approximation ADC 212 (see FIG. 2) reduces errors and improves the accuracy, precision and performance of the successive approximation ADC as compared to capacitative DAC architectures. Such capabilities are achievable through the selection of a current-steered architecture, and provision of the selectable reference voltage $V_{REF}$.

Figure 6:
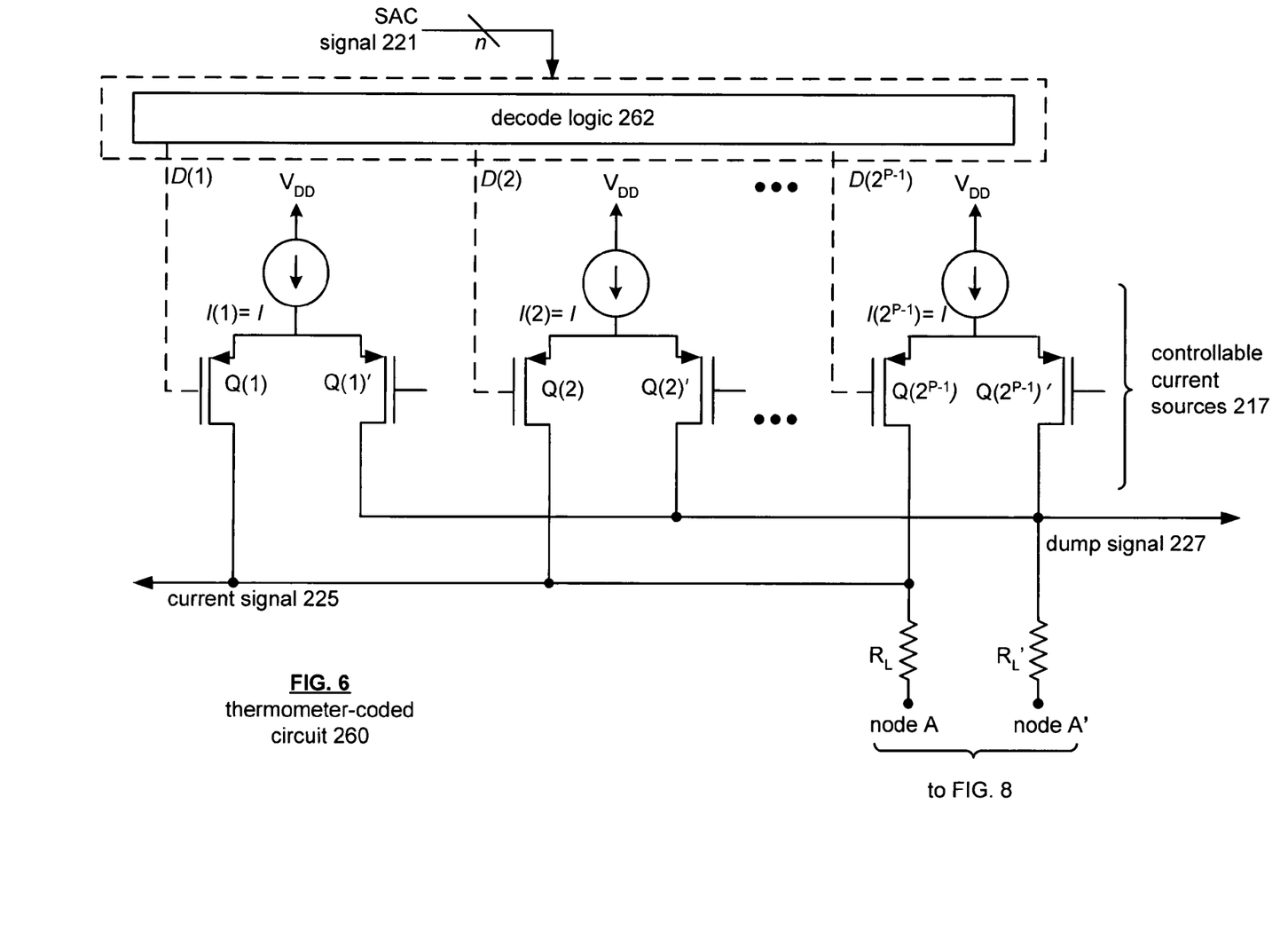
FIG. 6 illustrates a schematic diagram of a thermometer-coded circuit architecture for use in a current-steered DAC in accordance with the present invention.

FIG. 6 illustrates a schematic diagram of a thermometer-coded circuit architecture for use in the DAC core 219 of the current-steered DAC 214. As shown, the thermometer-coded circuit replicates a current proportional to the reference current source $I_{REF}$ 213 in each branch or leg of the controllable current sources 217 as there are branches I(1) through I($2^P$). For example, if the data size is 4 bits, then there are 32, or $2^4$, controllable current sources for a thermometer-coded circuit. Each of the branch current sources I(1) through I($2^P$) is switched 'on' or 'off' based on the input code D($2^0$) through D($2^{P-1}$), respectively, which are driven by the control logic module 215 (see FIG. 2) such that each of the controllable current sources 217 are switched between an "on" or "off" state with respect to the sampling interval provided by the clock signal 226 (see FIG. 2). It should also be noted that the current sources may be proportional to the reference current source $I_{REF}$.

As shown, the thermometer-coded circuit 260 is in a single-ended configuration, though differential switches are used for each of the branches or legs. In operation, each of the current sources I(1) through I($2^P$) are "on" when the data acquisition system 10 (see FIG. 1), or other device deploying the successive approximation ADC 212, is powered.

In the single-ended configuration each branch, or leg, has a signal side and a dump side. When the signal side is active or "on," the dump side is inactive or "off." Using the branch I(1) as an example, the signal side is denoted by the transistor Q(1), and the dump side is denoted as a prime by Q(1)'. Similar nomenclature is used with branches I(2) through I($2^P$). As shown, the signal side output of the thermometer-coded circuit 260 is provided through the current signal 225. The dump side output is provided through the dump signal 227. The branches are operably coupled to a voltage reference selector 280, which provides selectable values for the reference voltage $V_{REF}$. The signal sides of the branches are operably coupled to a voltage reference selector 280 at node A through a load resistance $R_L$. The dump sides of the branches are operably coupled to a voltage reference $V_{REF}$ at node A' through a load resistance $R_L'$. The voltage reference selector 280 is discussed further with respect to FIG. 8. Discussion of the operation of the thermometer-coded circuit 260 is made with respect to the signal sides of the branches. In the thermometer-coded circuit 260 of FIG. 6, each current branch I($2^0$) through I($2^{P-1}$) produces a substantially equal amount of current, and thus $2^P$ current source elements are used, which is assessed through the current signal 225. A decode logic 262 can be placed with the control logic module 215. The decode logic 262 takes the n-bit inputs provided by the SAC signal 221 and converts the n-bit inputs to thermometer code. For the thermometer-coded circuit 260, variable P equals n, which is the number of bits provided by the SAC signal 221. The thermometer code is used for controlling the current sources 217 of the thermometer-coded circuit 260. For example, the n-bit digital input is provided by the SAC signal 221 increases by one LSB, one additional current source is turned "on."

Even though thermometer-coded circuits tend to occupy larger amounts of integrated circuit area, including the associated decoding logic, these circuits have smaller differential nonlinearity ("DNL") error and the benefit of monotonicity—that is, the output signal magnitude increases as an input digital code increases. In other words, the decoder logic 262 controls the current sources through the controls D(1) through D($2^{P-1}$), then moving from one thermometer code to the next, one additional current source is turned "on," one additional current source is turned on, increasing the total output current of the current signal 225, thus providing a monotonic response. At the midcode of the DAC, when the digital input increments in either direction (as also illustrated in FIG. 5), the analog output is varied by a switch Q($2^0$) through Q($2^{P-1}$) transitioning to either "on" or "off", such as that shown in FIG. 6.

Figure 7:
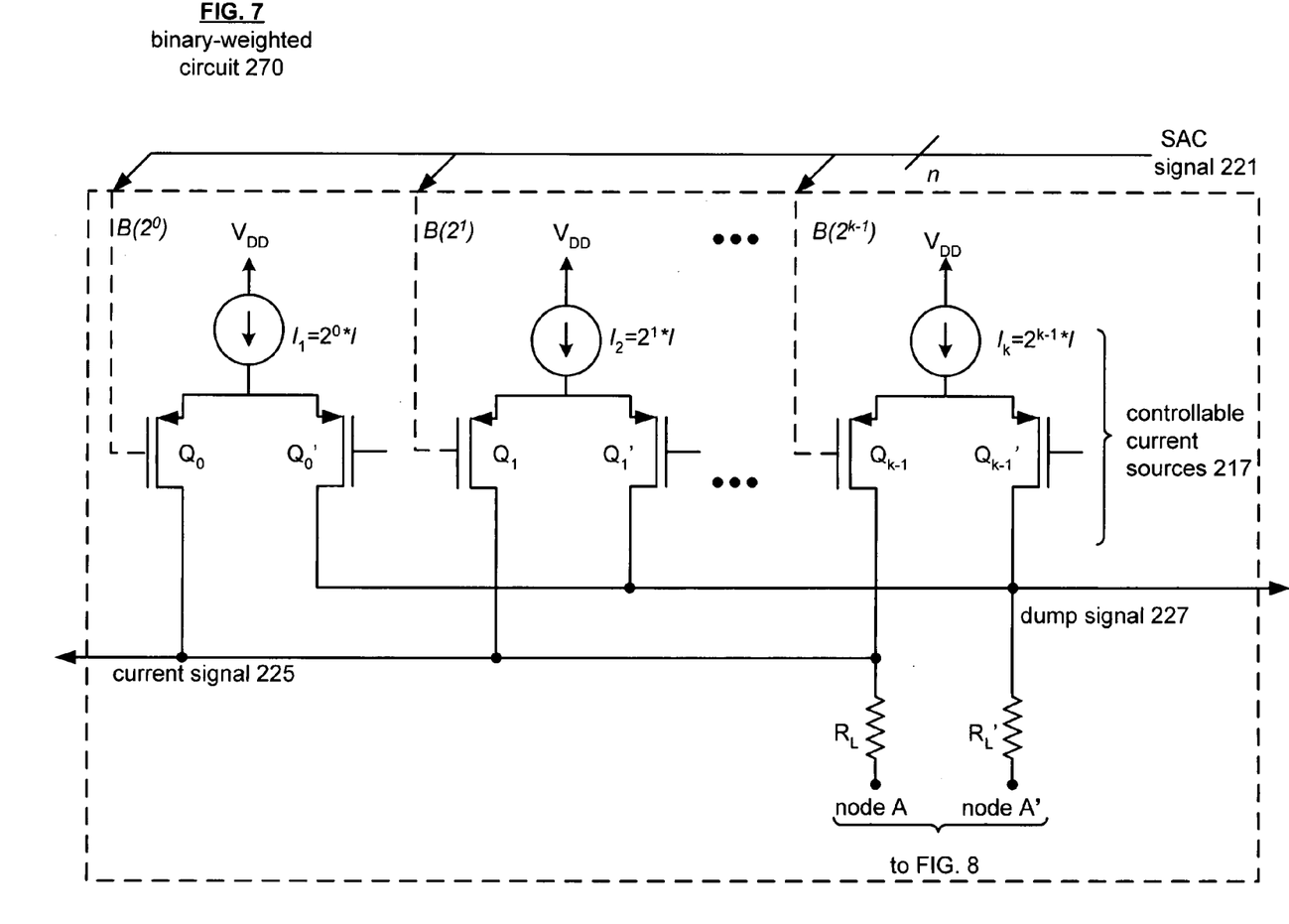
FIG. 7 illustrates a schematic diagram of a binary-weighted configuration for a current-steered DAC in accordance with the present invention.

FIG. 7 illustrates a schematic diagram of a binary-weighted circuit 270 for a current-steered DAC 214. Generally, for a binary-weighted circuit architecture, a reference current source $I_{REF}$ is multiplied by a power of two, creating larger currents to represent higher magnitude digital signals in the current legs. That is, each current source is binary-weighted to represent a corresponding data bit $B_1$ through $B_{2k-1}$, which is driven by the control logic module 215 (see FIG. 2). For the binary-weighted circuit 270, variable k=n, the number of bits provided by the SAC signal 221.

Each of the branch current sources $I_1$ through $I_k$ is switched 'on' or 'off' based on the input code B($2^0$) through B($2^{P-1}$), respectively, which are driven by the control logic module 215 (see FIG. 2) such that each of the controllable current sources 217 of the binary-weighted circuit 270 are switched between an "on" or "off" state with respect to the sampling interval provided by the clock signal 226 (see FIG. 2). It should also be noted that the current sources used in the binary-weighting may be proportional to the reference current source $I_{REF}$.

An advantage of a binary-weighted circuit 270 is that because the switching latches $Q_0$ through $Q_{K-1}$ are operably coupled to the data bits B($2^0$) through B($2^{k-1}$) of the control logic module 215 (see FIG. 2), the number of latches are minimized and a decode circuit is not necessary, providing a less complicated architecture than the thermometer-coded circuit 260. Eliminating the decoding logic and limiting the number of latches serves to decrease the footprint or the silicon area occupied, but also decreases the substrate noise from the digital circuits. A binary-weighted circuit 270, however, has a larger differential nonlinearity ("DNL") error compared to that of a thermometer-coded circuit.

As shown, the binary-weighted circuit 270 is in a single-ended configuration, though differential switches are used for each of the branches or legs. In operation, each of the current sources $I_1$ through $I_k$ are "on" when the data acquisition system 10 (see FIG. 1), or other device deploying the successive approximation ADC 212, is powered.

In the single-ended configuration each branch, or leg, has a signal side and a dump side. When the signal side is active or "on," the dump side is inactive or "off." Using the branch $I_1$ as an example, the signal side is denoted by the transistor $Q_0$, and the dump side is denoted as a prime $Q_0'$. Similar nomenclature is used with branches $I_2$ through $I_k$. As shown, the signal side output of the binary-weighted circuit 270 is provided through the current signal 225. The dump side output is provided through the dump signal 227. The branches are operably coupled to a voltage reference selector 280, which provides a selectable value for the reference voltage $V_{REF}$. The signal sides of the branches are operably coupled to a voltage reference selector 280 at node A through a load resistance $R_L$. The dump sides of the branches are operably coupled to a voltage reference $V_{REF}$ at node A' through a load resistance $R_L'$. The voltage reference selector is discussed further with respect to FIG. 8.

Each of the switches $Q_0$ through $Q_{K-1}$ switch a current source to the output current signal 225 that is twice the corresponding previous bit. The input code provided by the SAC signal 221 is operably coupled to the switches $Q_0$ through $Q_{K-1}$ without the need for a decode or a translation circuit.

The current-steered DAC 214 can be provided in a binary-weighted configuration or a thermometer-coded configuration or a combination thereof. Combinations of binary-weighted and thermometer-coded circuits 270 and 260, respectively, are referred to as segmented designs, which are useful for higher resolution, or bit-count, DAC circuits. Generally, a fully binary-weighted design in the DAC 214 is referred to as 0% segmented, whereas a fully thermometer-coded design is referred to as 100% segmented. Thus, the segmentation can be represented as "p(MSB)+k(LSB)" where the sum of p-bits and k-bits equal the number of bits n of the SAC signal 221.

Thermometer-coded digital-to-analog converters have improved differential nonlinearity ("DNL"). Binary-weighted digital-to-analog converters occupy less area. A suitable combination is to use the thermometer coding for the Most Significant Bits ("MSB") of the digital-to-analog converter, while using the binary coding for the Least Significant Bits ("LSB") of the digital-to-analog converter. Generally, thermometer coding is used in the MSB portion where greater accuracy is desired.

It should be noted that the thermometer-coded circuit 260 and the binary-weighted circuit 270 as shown in FIGS. 6 and 7, respectively, are shown in single-ended form with differential switches as discussed above. As can be readily appreciated by those of ordinary skill that a differential configuration of the thermometer-coded circuit 260 and the binary-weighted circuit 270 may be placed in a differential operation mode, as well as other circuit configurations, to achieve similar results.

Figure 8:
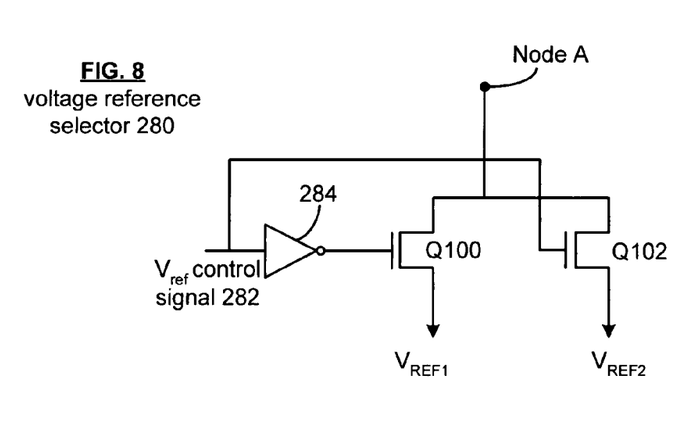
FIG. 8 illustrates a schematic diagram of a voltage reference selector in accordance with the present invention.

FIG. 8 illustrates a schematic diagram of a voltage reference selector 280 to the digital-to-analog converter. The voltage reference selector 280 provides a plurality of selectable voltage reference values. By way of example, shown are a pair of voltage reference values $Vref_1$ and $Vref_2$, coupled to switches Q100 and Q102, which are operably coupled to a Vref control signal 282, which provides an inverted signal to the switch Q100 from inverter 282. The reference values $Vref_1$ and $Vref_2$ provide the ground reference voltages, "0 Vref" for the magnitude of Vref (see FIG. 5).

The voltage reference selector 280 provides a node A. The node A of the voltage reference selector 280 corresponds to the node A of the the thermometer-coded circuit 260 of FIG. 6, and the binary-weighted circuit 270 of FIG. 7, as well as for a segmented circuit utilizing the structures of the thermometer-coded circuit 260 and of the binary-weighted circuit 270. Similarly, the same or an additional voltage reference selector 280 may be operatively coupled to the dump side node A' of the thermometer-coded circuit 260 of FIG. 6, and the binary-weighted circuit 270 of FIG. 7, as well as for a segmented circuit utilizing the structures of the thermometer-coded circuit 260 and of the binary-weighted circuit 270.

The ground voltage references $Vref_1$ and $Vref_2$ are selectable for the current-steered DAC 214 (see FIG. 1). Providing this capability allows flexibility and adaptation of the successive approximation ADC 212 by permitting selection of a suitable voltage reference based on an analog input $V_{IN}$ signal 232 provided from a plurality of available inputs. In some instances, without using a selectable voltage reference, a voltage error of about 10 mV could exist, which affects the accuracy of the analog-to-digital conversion.

As an example, one of the channels provided to the MUX 12 is an external source, such as an external power source (see FIG. 2). The voltage reference $Vref_1$ is an external ground source, and the voltage reference $Vref_2$ is an internal ground source. The MUX 12 provides to the successive approximation ADC 212 through the analog input $V_{IN}$ signal 232 the external source channel. Through microprocessor or microcontroller control, acting on software or firmware instructions, the voltage reference $V_{ref}$ is set to voltage reference $Vref_1$ through the Vref control signal 82.

Notably, the ground voltage references $Vref_1$ and $Vref_2$ can be attributed other reference values other than ground voltage references, adding flexibility to the available voltage references. Further, it should be noted that additional reference voltages may be used, with associated control logic. As can also be readily appreciated, in a differential operation mode or configuration as opposed to the single-ended configuration, selection of the ground voltage references $Vref_1$ and $Vref_2$ through the voltage reference selector 280 operates to shift the common mode of the differential signals. In the single-ended configuration, selection of the ground voltage references through the voltage reference selector 280 operates to provide the selection of ground references.

In general, whether thermometer-coded, binary-weighted, or a combination thereof, the current-steered DAC layout replicates a reference current source $I_{REF}$. A current-steered DAC provides greater accuracy over capacitative DACs because there are fewer sources of error as compared with charge redistribution circuits and use of a sample-and-hold circuit. That is, for every switching event of a charge redistribution DAC, capacitor mismatch provides a source of error, as does the sampling. The successive approximation ADC 212 of FIG. 2 allows the elimination of a sample-and-hold circuit at the comparator module 216. Accordingly, potential sources of error are eliminated, in view of the elimination of a charge redistribution architecture, and the ability to remove the sample-and-hold circuitry afforded by use of a current-steered DAC architecture. Further, elimination of a capacitor redistribution architecture allows use of generic fabrication processes, which are more readily available.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (that is, where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that a first signal has a greater magnitude than a second signal, a favorable comparison may be achieved when the magnitude of the first signal is greater than that of the second signal or when the magnitude of the second signal is less than that of the first signal.

The preceding discussion has presented a method and apparatus for a successive approximation ADC having a current-steered DAC, which in general provides greater conversion accuracy. As one of ordinary skill in the art will appreciate, other embodiments may be derived from the teachings of the present invention without deviating from the scope of the claims.

What is claimed is:

1. A successive approximation Analog-to-Digital Converter ("ADC") comprises:
   a successive approximation controller ("SAC") operably coupled to convert a control signal into a digital output of the successive approximation ADC;
   a current-steered Digital-to-Analog Converter ("DAC") operably coupled to convert the digital output of the successive approximation ADC into an analog feedback signal, wherein the current-steered DAC includes a voltage reference selector operable to produce a plurality of voltage reference values, wherein the reference voltage is selected from the plurality of voltage reference values and is based on the analog input of the successive approximation ADC; and
   a comparator module operably coupled to compare the analog feedback signal with an analog input of the successive approximation ADC to produce the control signal.

2. The successive approximation ADC of claim 1, wherein the comparator module comprises:
   a comparator having a first input, a second input, and an output, wherein the second input of the comparator is operably coupled to receive the analog feedback signal; and
   a sample-and-hold circuit having an input and an output, the sample-and-hold circuit input operably coupled to generate a selectively sampled-and-held representation of an analog signal, and the sample-and-hold circuit output operably coupled to provide the analog input of the successive approximation ADC to the first input of the comparator.

3. The successive approximation ADC of claim 1, wherein the SAC comprises:
   a successive approximation logic, and
   a register operably coupled to the successive approximation logic, in which the successive approximation logic manipulates a register content of the register according to the control signal.

4. The successive approximation ADC of claim 3, wherein the current-steered digital-to-analog converter comprises:
   a plurality of controllable current sources each being controllable between a first state and a second state; and
   a control logic module coupled to the controllable current sources and configured to (i) control digital to analog conversion based on a sampling interval and (ii) control each of the controllable current sources to switch between the first state and the second state with respect to the sampling interval.

5. The successive approximation ADC of claim 1 wherein:
   the first and the second inputs of the comparator are differential inputs.

6. The successive approximation ADC of claim 1 wherein:
   the current-steered DAC comprises at least one of a thermometer-weighted topology and a binary-weighted topology.

7. A successive approximation Analog-to-Digital Converter ("ADC") comprising:
   a current-steered Digital-to-Analog Converter ("DAC") operable to convert a digital output of the successive approximation ADC into an analog feedback signal, wherein the current-steered DAC includes a voltage reference selector operable to produce a plurality of voltage reference values, wherein the reference voltage is selected from the plurality of voltage reference values and is based on the analog input of the successive approximation ADC; and
   a successive approximation controller ("SAC") operably coupled to produce the digital output of the successive approximation ADC based on a comparison result signal, wherein the comparison result signal indicates a successive relative position of the analog feedback signal with respect to an analog input voltage of the successive approximation ADC such that the digital output corresponds to the analog input voltage.

8. The successive approximation ADC of claim 7 wherein:
   the analog output of the current-steered DAC and the analog input voltage of the successive approximation ADC are each of a differential signal format.

9. The successive approximation ADC of claim 7 wherein the current-steered DAC comprises:
   at least one of a thermometer-weighted topology and a binary-weighted topology.

10. The successive approximation ADC of claim 7 further comprises:
    a sample-and-hold circuit having an input and an output, the input operably coupled to generate a selectively sampled-and-held representation of an analog signal, and the output operably coupled to provide the analog input voltage of the successive approximation ADC for comparison to the analog output of the current-steered DAC.

11. The successive approximation ADC of claim 10 wherein:
    the analog output of the current-steered DAC and the analog input voltage of the successive approximation ADC are each of a differential signal format.

12. The successive approximation ADC of claim 11 wherein:
    the current-steered DAC comprises at least one of a thermometer-weighted topology and a binary-weighted topology.

13. The successive approximation ADC of claim 7 further comprises:
    a sample-and-hold module operably coupled to provide the analog input voltage for comparison to the analog output of the current-steered DAC.

14. The successive approximation ADC of claim 13 wherein the current-steered DAC comprises:
    at least one of a thermometer-weighted topology and a binary-weighted topology.

* * * * *